US009105958B2

(12) United States Patent
Suddath

(10) Patent No.: US 9,105,958 B2
(45) Date of Patent: Aug. 11, 2015

(54) PSEUDO-ANTENNA AND SYSTEM AND METHOD FOR MANUFACTURE OF THE SAME

(75) Inventor: Ralph M. Suddath, Hickory Creek, TX (US)

(73) Assignee: Live Longer, LLC, Prosper, TX (US)

( * ) Notice: Subject to any disclaimer, the term of this patent is extended or adjusted under 35 U.S.C. 154(b) by 478 days.

(21) Appl. No.: 13/555,480

(22) Filed: Jul. 23, 2012

(65) Prior Publication Data

US 2013/0328729 A1 Dec. 12, 2013

Related U.S. Application Data

(60) Provisional application No. 61/657,950, filed on Jun. 11, 2012.

(51) Int. Cl.
*H01F 27/26* (2006.01)
*G01R 29/10* (2006.01)
*H01Q 1/00* (2006.01)

(52) U.S. Cl.
CPC ............. *H01Q 1/00* (2013.01); *Y10T 29/49016* (2015.01)

(58) Field of Classification Search
CPC ......... H01Q 1/00; H01Q 21/062; H01Q 1/36; H01Q 3/26; Y01T 29/49016
See application file for complete search history.

(56) References Cited

U.S. PATENT DOCUMENTS

| | | | | |
|---|---|---|---|---|
| 6,037,774 | A | 3/2000 | Felmlee et al. | |
| 6,265,788 | B1 | 7/2001 | Davidson et al. | |
| 6,455,815 | B1 | 9/2002 | Melgaard et al. | |
| 6,700,806 | B2 | 3/2004 | Kolar | |
| 7,514,818 | B2 | 4/2009 | Abe et al. | |
| 7,675,197 | B2 | 3/2010 | Tetlow | |
| 7,843,709 | B2 | 11/2010 | Umeda et al. | |
| 7,960,867 | B2 * | 6/2011 | Issa et al. | 307/104 |
| 8,247,926 | B2 * | 8/2012 | Issa et al. | 307/104 |
| 2009/0134711 | A1 * | 5/2009 | Issa et al. | 307/104 |
| 2011/0165837 | A1 | 7/2011 | Issa et al. | |
| 2013/0100000 | A1 * | 4/2013 | Reavis et al. | 343/895 |

OTHER PUBLICATIONS

N.I. Cho, Y.M. Kim, J.S. Lim, C. Hong, Y. Sul, C.K. Kim, Laser annealing effect of SiC films prepared by PECVD (plasma enhanced chemical vapor deposition), Elsevier Science B.V., Thin Solid Films 409 (2002), pp. 1-7.

* cited by examiner

*Primary Examiner* — Trinh Dinh
(74) *Attorney, Agent, or Firm* — Scott T. Griggs; Griggs Bergen LLP

(57) ABSTRACT

A pseudo-antenna and system and method for manufacturing the same are disclosed. In one embodiment of the pseudo-antenna, a substrate is provided including a surface layer selected from the group consisting of tetrel-based and metal materials. The surface layer is annealed by application of a static pulse from a Tesla emitter at ambient conditions. The surface layer presents a normalized unit structure having at least one phonon representing a micro-crystal surface effect and absorption band. Further, the surface layer presents imperfect harmonic interaction with the carrier wave.

9 Claims, 4 Drawing Sheets

*Fig.3A*
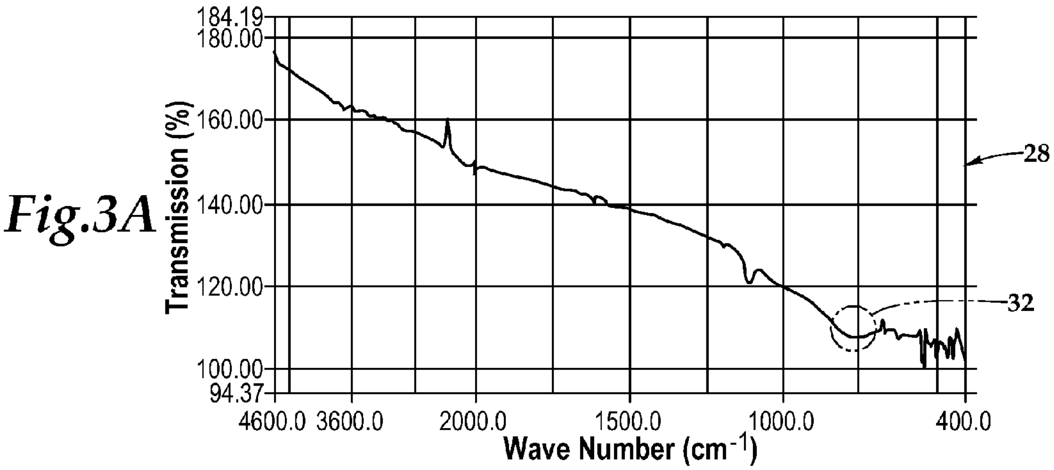
*Fig.3B*
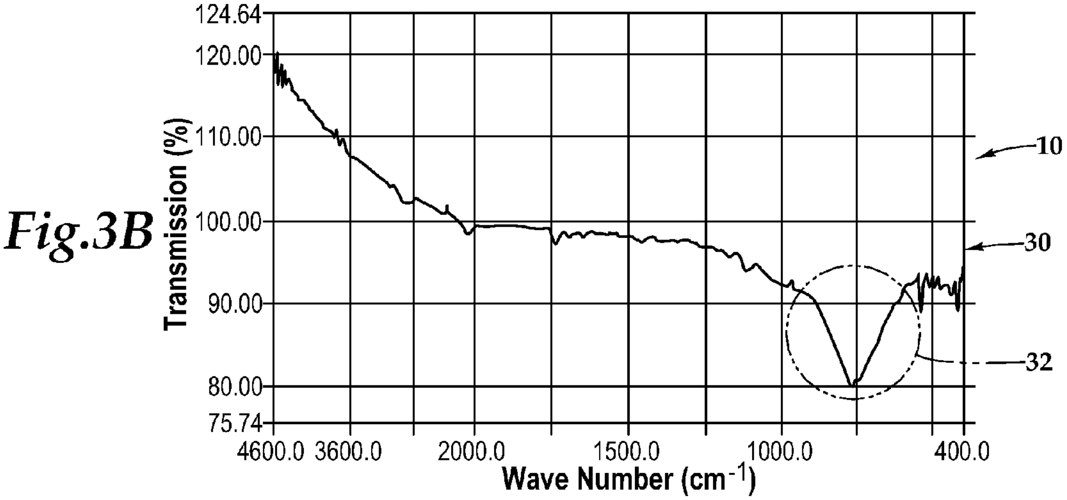
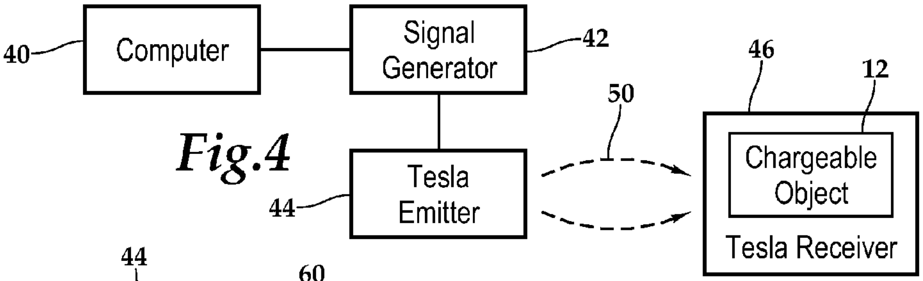
*Fig.4*
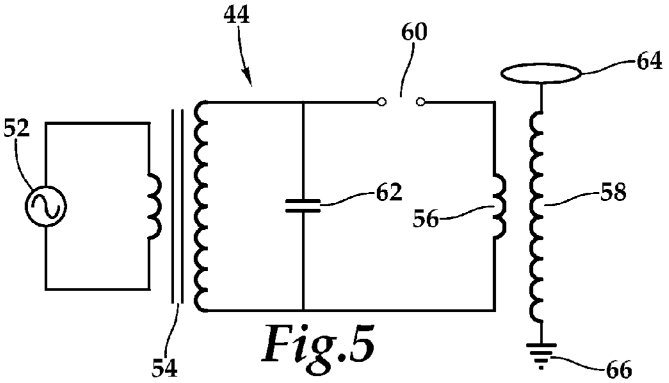
*Fig.5*

PSEUDO-ANTENNA AND SYSTEM AND METHOD FOR MANUFACTURE OF THE SAME

PRIORITY STATEMENT & CROSS-REFERENCE TO RELATED APPLICATIONS

This application claims priority from U.S. Patent Application No. 61/657,950, entitled "Pseudo-Antenna and System and Method for Manufacture of the Same" and filed on Jun. 11, 2012 in the name of Ralph M. Suddath; which is hereby incorporated by reference for all purposes.

TECHNICAL FIELD OF THE INVENTION

This invention relates, in general, to antennas of radiating and receiving elements having various imperfections and, in particular, to pseudo-antennas and systems and methods for manufacture of the same.

BACKGROUND OF THE INVENTION

Without limiting the scope of the present invention, its background will be described with reference to electromagnetic field (EMF) radiation interacting with humans, as an example. The negative effects of high intensity EMF radiation on humans have been proved conclusively. High intensity EMF radiation damages basic cell structure and DNA. With respect to low intensity EMF radiation, it is now acknowledged that EMF radiation influences the environment. The degree to which short-term and long-term exposure to low intensity EMF radiation impacts humans is now an area of ongoing study and intense debate with credible evidence mounting that demonstrates the degree to which short-term and long-term exposure negatively impact the human body.

SUMMARY OF THE INVENTION

It would be advantageous to achieve an antenna or pseudo-antenna that mitigates high and low intensity EMF radiation on humans and other animals. It would also be desirable to enable an electromagnetic-based solution that furnishes a methodology to build or create pseudo-antennas compatible across many different article types. To better address one or more of these concerns, in one aspect of the invention, a pseudo-antenna and system and method for manufacturing the same are disclosed.

In one embodiment of the pseudo-antenna, a substrate is provided including a surface layer selected from the group consisting of tetrel-based and metal materials. The surface layer is annealed by application of a static pulse from a Tesla emitter at ambient conditions in order to charge the surface layer. The static pulse includes a carrier wave selected from the group consisting of waves with a frequency (f) expressed in Hertz represented by the following vector equation: $f=(1,7,4)+(1,1,1)$ MOD 9; and waves with a frequency ($f_n$) expressed in Hertz represented by the following equation: $f_n=(c/2\pi a)(\sqrt{n(n+1)})$, wherein c is the speed of light and a is the Earth's radius. Following annealing, the surface layer presents a normalized unit structure having at least one phonon representing a micro-crystal surface effect and absorption band. Further, the surface layer presents imperfect harmonic interaction with the carrier wave. These and other aspects of the invention will be apparent from and elucidated with reference to the embodiments described hereinafter.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which:

FIG. 3A is a spectrum analysis of the amorphous state surface of the tetrel-based object of FIG. 1A, prior to ambient annealing;

FIG. 3B is a spectrum analysis of the annealed surface of the tetrel-based object of FIG. 1B, following ambient annealing;

FIG. 4 is a schematic block diagram of one embodiment of a system for ambient annealing of tetrel-based and metal materials;

FIG. 5 is a schematic circuit diagram of one embodiment of a Tesla emitter, which forms a component of the system presented in FIG. 4;

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention, and do not delimit the scope of the present invention.

Figure 1A:
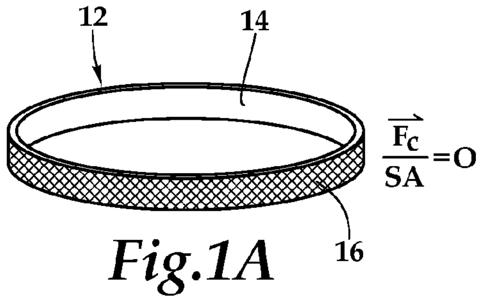
FIG. 1A is a front perspective view of one embodiment of a tetrel-based object prior to ambient annealing and the formation of a pseudo-antenna.
Figure 1B:
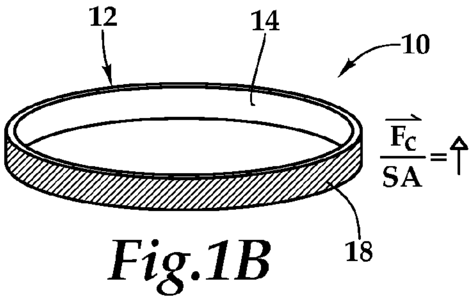
FIG. 1B is a front perspective view of the tetrel-based object shown in FIG. 1A following ambient annealing, wherein the annealed surface of the object affects the photonic properties thereof and a pseudo-antenna is formed.

Referring initially to FIGS. 1A and 1B, therein is depicted a pseudo-antenna 10 being made from an article of manufacturer 12 prior to (FIG. 1A) and following (FIG. 1B) the surface ambient annealing methodology that creates the pseudo-antenna. The article of manufacturer 12 has the form of a chargeable object having a substrate 14 and an amorphous surface layer 16, which annealed is annealed surface layer 18. In the illustrated embodiment, the article of manufacture 12 is ring, bracelet, or collar shaped. The article of manufacture 12 and corresponding pseudo-antenna 10 may have any shape or form, however. Additionally, the article of manufacture may include a tetrel-based or metal material at or proximate to the surface as the surface layer 16 to be annealed. The tetrel-based material may be any carbon ⓒ or silicon (Si)-based material or metal, such as iron (Fe) or zinc (Z)-based materials. As depicted, the article of manufacture includes a silicone-carbon (SiC)-based material.

The force, $F_c$, for a surface area, SA, may be the electric component of the electromagnetic field and polarization and the magnetic components associated with the surface of the article of manufacture. In the absence of an applied photonic or field causing a Casimir effect ($\vec{F}c/SA=0$), the force axes of the article of manufacture have no preferred state, so that incident forces essentially encounter a mismatch, as shown in FIG. 1A.

On the other hand, as shown in FIG. 1B, the surface imparts an applied force ($F_c$) per surface area, SA, to the article of manufacture 12 creating an aligned state that may affect one or more physical properties related to the photonics and electromagnetics of the article of manufacture 12. Through a derivative effect, the article of manufacture may then be said to "be charged" and similarly impart the applied force to other objects. In one implementation, where the force may be expressed as sums over the energies and charges of standing waves, which may be formally understood as sums over the eigenvalues of a Hamiltonian, the force, $F_c$, causes atomic and molecular effects, such van der Waals force-related effects, that may cause state changes in the surface of article of manufacture. If one considers the Hamiltonian of a system as a function of the arrangement of objects, such as atoms, in configuration space, then the zero-point energy of the article of manufacture as a function of changes of the configuration can be understood as a result of the applied force, $F_c$. This results in a pseudo-antenna. As a pseudo-antenna, antenna feedback requirements may lead to various forms of imperfection, such as feed-back imperfection, namely, channel estimation errors; channel quantization; and feedback delay. It should be appreciated that the applied force and resulting state changes described in FIGS. 1A and 1B are not limited to ring-shaped objects of manufacturer; such an object is presenting as a non-limiting example.

Figure 2A:
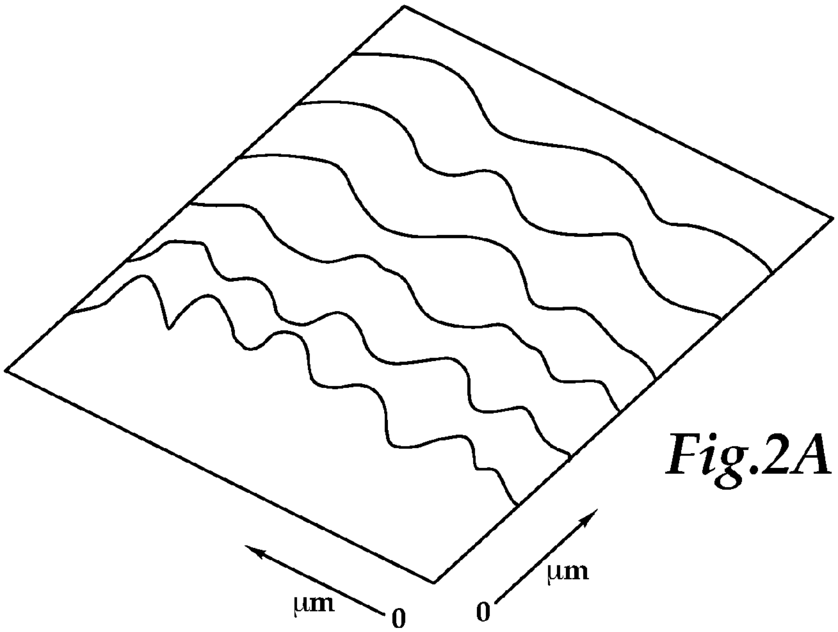
FIG. 2A is a topographic representation of the amorphous state surface of the tetrel-based object of FIG. 1A, prior to ambient annealing.
Figure 2B:
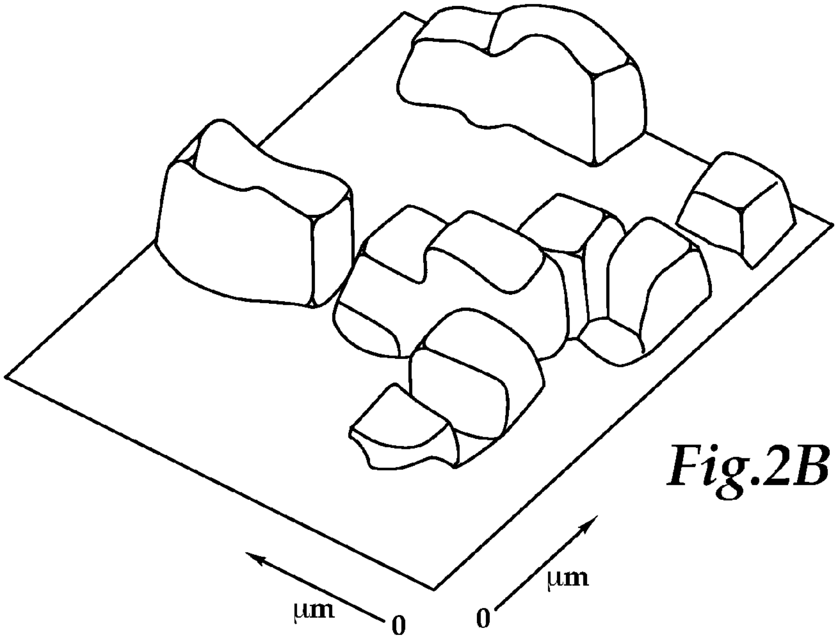
FIG. 2B is a topographic representation of the annealed surface of the tetrel-based object of FIG. 1B, following ambient annealing.

Referring now to FIGS. 2A and 2B, the conceptualized surface topographies 20, 22 illustrate that the ambient annealing made the amorphous silicon-carbon (a-SiC) surface at surface layer 16 transform into an ordered structure, represented by surface layer 18. Generally, the bonding strength and behavior of the atoms in the ordered structure is different from the amorphous state, and in the ordered state interaction with external forces is markedly different. As shown by a comparison of the surface topographies 20, 22, surface layer 16 has a topology 24 which may be described as scattered and feeble, while surface layer 18 has a topology 26 which may be described as ordered and stabilized. FIGS. 3A and 3B support FIGS. 2A and 2B. The conceptualized FTIR spectra 28, 30 illustrate that the ambient annealing made the amorphous silicon-carbon (a-SiC) surface at surface layer 16 transform into an ordered structure, as represented by the lack of an absorption band at the SiC absorption band location 32 in FIG. 3A and the presence of a distinct SiC absorption band location 32 in FIG. 3B, corresponding to the ordered silicon carbon (o-SiC) surface created by the annealing. It may be surmised that the amorphous silicone-carbon (a-SiC) contains defects, such as dislocation and stacking of fault layers. As shown, the annealing process causes at least one phonon representing a micro-crystal surface effect and absorption band development. The annealed surface layer includes a quantized energy level reflecting a longitudinal optical and/or transverse optical phonon resulting from the structure change brought about by the ambient annealing.

Referring to FIG. 4, in one system implementation, a computer 40 is coupled to a driver or signal generator 42 which drives an alternating current signal having a carrier to the Tesla emitter 44, which is coupled by an electromagnetic coupling field 50 to the Tesla receiver 46. The carrier wave may be one of the following:

waves with a frequency (f) expressed in Hertz represented by the following vector equation: f=(1,7,4)+(1,1,1) MOD 9; and waves with a frequency ($f_n$) expressed in Hertz represented by the following equation: $f_n=(c/2\pi a)(\sqrt{n(n+1)})$, wherein c is the speed of light and a is the Earth's radius.

The chargeable object or article of manufacture 12 is associated with the Tesla receiver 46. The induced electro-magnetic coupling, having the carrier wave discussed hereinabove, between the Tesla emitter 44 and the Tesla receiver 46 anneals the surface layer 16 of the chargeable object 12, thereby changing the amorphous tetrel-based or metal-based surface layer into an ordered surface layer, as discussed above.

Referring to FIG. 5, one embodiment of the Tesla emitter 44 is depicted in further detail. An alternating current AC mains 52 is coupled to a high voltage transformer 54, which is interposed between the AC mains 52 and primary and secondary windings 56, 58. A spark gap 60 and a high voltage capacitor 62 are positioned between the high voltage transformer 54 and the primary and secondary windings 56, 58. A torus 64 and ground 66 are associated with the secondary winding 58. This exemplary circuit is designed to be driven by alternating currents. In particular, the spark gap 60 shorts the high frequency across the high voltage transformer 54. An inductance, not shown, protects the transformer.

Figure 6A:
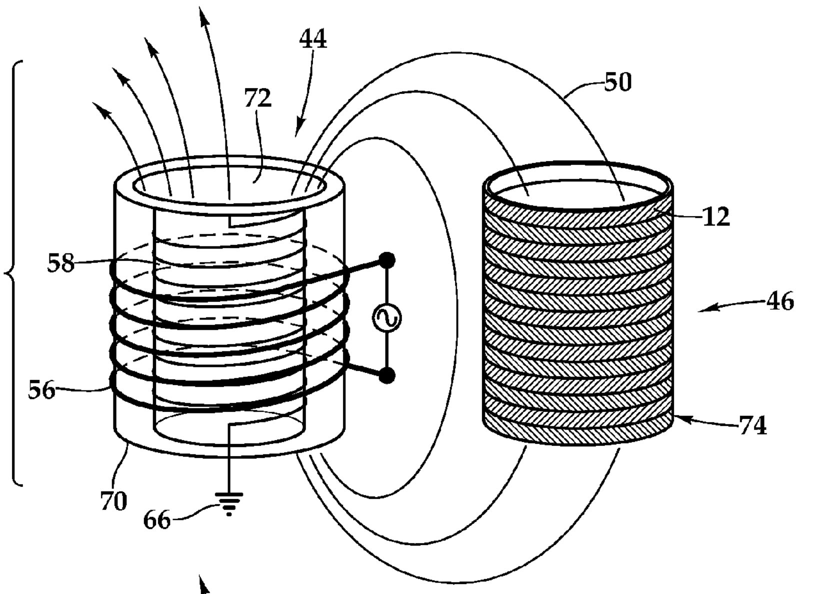
FIGS. 6A through 6C depict embodiments of three different tetrel-based and metal materials being annealed.
Figure 6B:
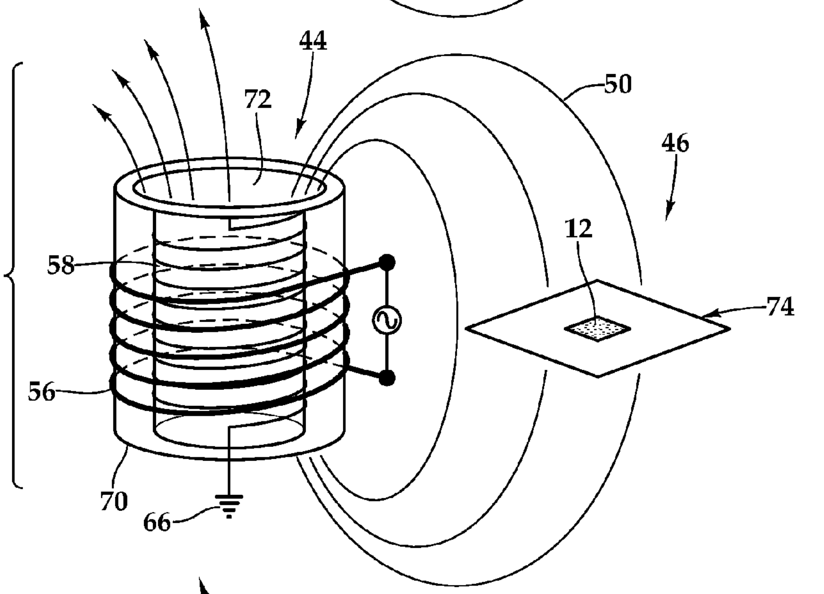

Referring now to FIGS. 6A through 6B, non-limiting embodiments of three different tetrel-based and metal materials being annealed are depicted. With respect to FIG. 5A, the Tesla emitter 44 resonates with the Tesla receiver 46, which may be electromagnetically coupled to the Tesla emitter via the time-varying magnetic and/or electric field 50. The Tesla emitter 44 and the Tesla receiver 46 may be oriented parallel to each other. The emitting Tesla emitter 44 may emit the field, while the receiving Tesla receiver 46 may subtend the electromagnetic field from the Tesla emitter 44. In one implementation, parallel orientation of the Tesla emitter 44 and the Tesla receiver 46 may ensure maximum flux coupling therebetween.

Figure 6C:
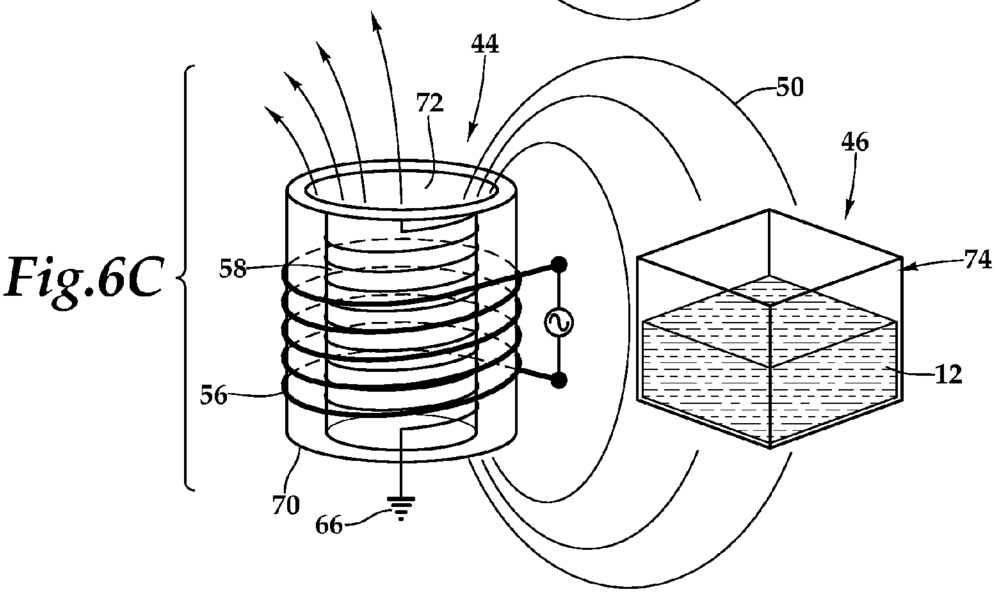

As shown, the Tesla emitter 44 may include the primary winding 56, the secondary winding 58, support apparatus 70 for the primary winding 56, and support apparatus for the secondary winding 58. The Tesla receiver 46 may include a receptacle 74, which may be a cylinder (FIG. 6A), a plate (FIG. 6B), or container (FIG. 6C), for example. The primary and secondary windings 44, 46 may include any common wiring material used in the implementation or construction of coils and transformers. Other aspects may use other materials. The primary structural supports 70 and the secondary structural supports 72 may be composed of ceramic, plastic, Plexiglas®, or any other insulating or nonconductive (e.g., dielectric material). The primary winding 56 may be wrapped in a helically-coiled fashion, where each individual primary winding turn may be wrapped in a helically-coiled fashion, where each individual secondary winding is oriented similarly and complimentary to the individual primary windings. It should be appreciated that the drawings of the primary and secondary windings are illustrative and not intended to show the exact number of turns, ratio of turns, gauge of windings, or other aspects.

It should be understood that the electro-magnetic-based annealing furnished by the Tesla emitter, which produces the pseudo-antenna 10 by way of an energy transfer having a carrier wave is not limited to being employed in any particular chip or article of clothing or garment. By way of example and not by way of limitation, the pseudo-antenna 10 may be incorporated into a bracelet, anklet, pocket chip, automotive chip, under garment, shoe insert, sock, glove, pants, vest, jacket, wrist band, watch, pillow, sheets, coffee cup, glass, label, storage container, or other item of manufacture. Moreover, these articles of manufacture in which the planar antenna array 10 may be associated with are not limited to those typically used by humans. Items and articles of manufacture used by animals or pets, such as bowels, harnesses, sweaters, collars, blankets, feeding and drinking troughs, may also include the pseudo-antenna 10.

Figure 7B:
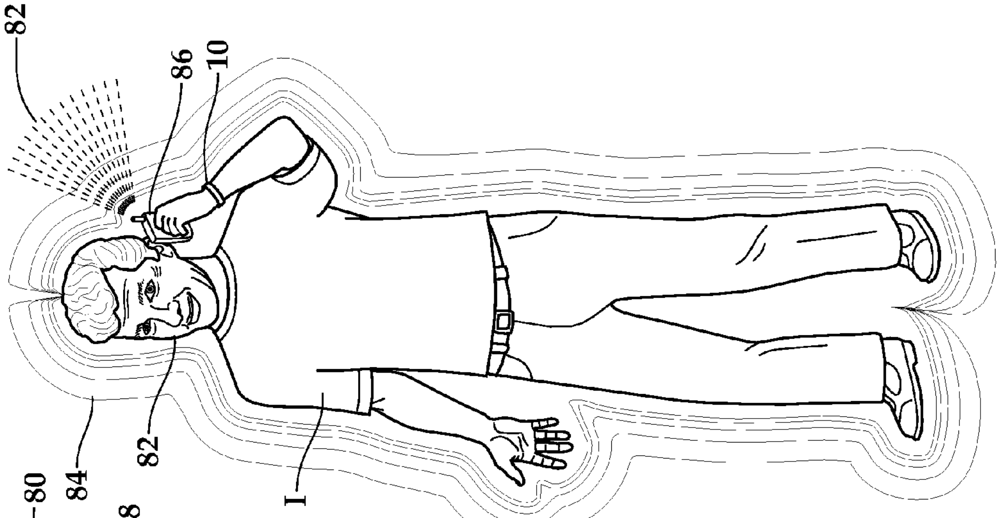
FIGS. 7A and 7B are schematic views of one embodiment of an annealed article of manufacture mitigating low-intensity EMF radiation on humans.
Figure 7A:
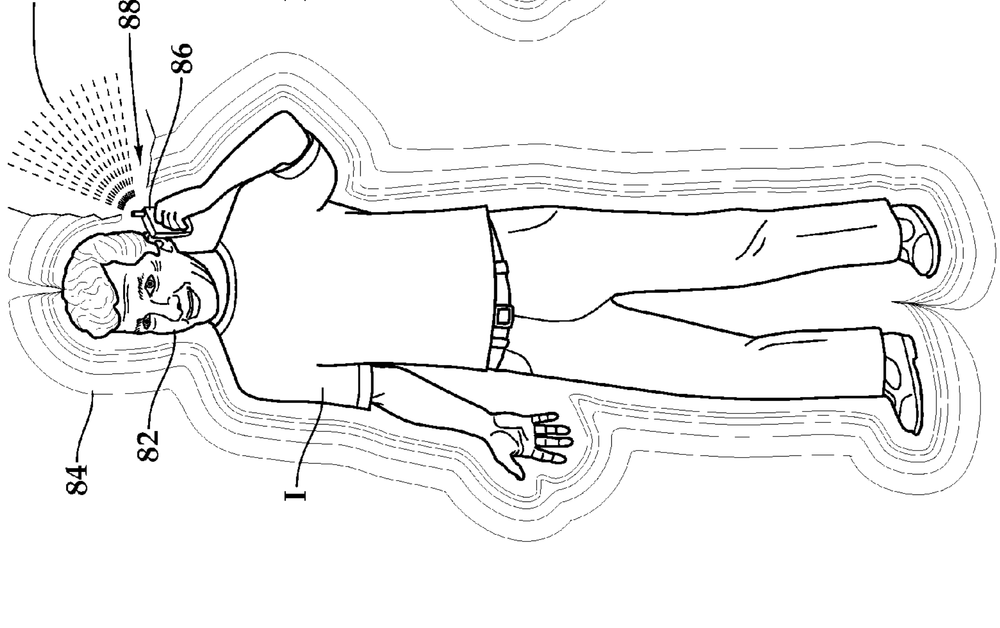

FIGS. 7A and 7B are schematic views of one embodiment of the pseudo-antenna 10 mitigating low-intensity EMF radiation 80 on a human or individual 82 having an EMF field 84 therearound, which may be referred to as biofield. In FIG. 7A, the biofield 84 of the individual is negatively impacted by EMF radiation 80 from a source 86, which is depicted as a cellular telephone. It should be appreciated, however, that the source may comprise any object or device, natural or man made, that emits EMF radiation. This negative impact may take one of many forms including inflammation in the body, decreased cellular oxygenation, reduced stamina and endurance, agitated nervous system, muscle tension, spasms, cramping, headaches and migraine pains, or decreased digestive function, for example. As depicted, the negative impact is shown by number 88.

As shown in FIG. 7B, the pseudo-antenna 10 is associated with the individual 82 as being embedded or integrated into an article of manufacture 12. In one implementation, the pseudo-antenna 10 exhibits imperfect antenna behavior, including photoconductive and electro-optic behavior, and, as such, the pseudo-antenna 10 has the ability to detect and store spatial distributions of optical intensity from EMF radiation in the form of spatial patterns of altered refractive index. Such photoinduced charges create a space-charge distribution that produces an internal electric field, which, in turns mitigates the negative effects of any low-intensity EMF radiation as shown by the healthy biofield 64. As previously alluded, however, the applications of the pseudo-antenna 10 are not limited to mitigating the negative effects of EMF radiation. Additionally, in particular embodiments improved balance, flexibility, energy, strength, recovery, immunity, and/or relaxation are imparted as is a decrease in stress.

Figure 8:
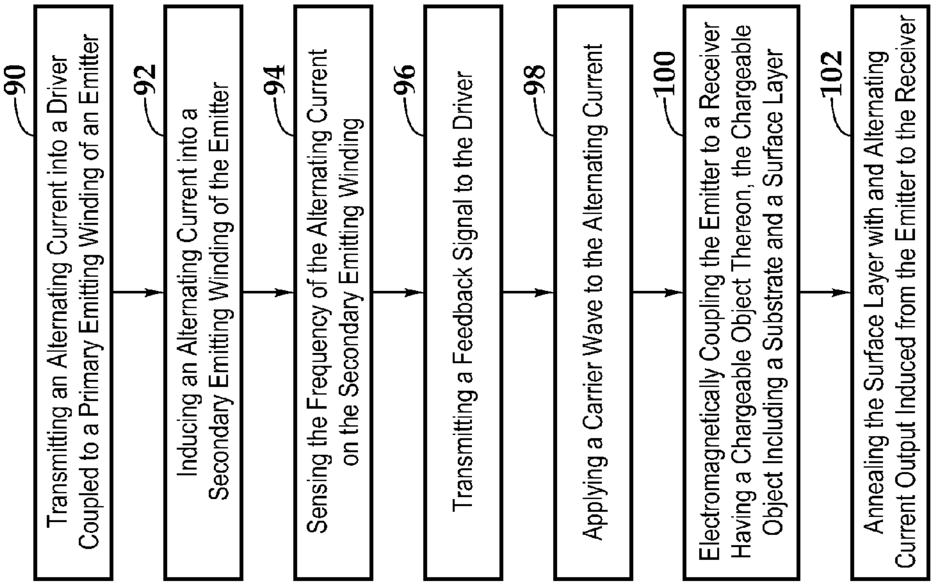
FIG. 8 is a flow chart depicting one embodiment of a method for ambient annealing of tetrel-based and metal materials.

Referring to FIG. 8, one embodiment of a method for ordering the surface structure of a material to create a pseudo-antenna is illustrated. At block 90, an alternating current is transmitted into a driver coupled to a primary emitting winding of an emitter. At block 92, the alternating current is induced into a secondary emitting winding of the emitter. Next, at block 94, the frequency of the alternating current is sensed on the secondary emitting winding and responsive thereto at block 96, a feedback signal is transmitted to the driver.

Continuing with the methodology, at block 98, a carrier wave is applied to the alternating current. As previously discussed, the carrier wave may be one of the following:

- waves with a frequency (f) expressed in Hertz represented by the following vector equation: f=(1,7,4)+(1,1,1) MOD 9; and
- waves with a frequency ($f_n$) expressed in Hertz represented by the following equation: $f_n=(c/2\pi a)(\sqrt{n(n+1)})$, wherein c is the speed of light and a is the Earth's radius.

At block 100, the emitter is electromagnetically coupled to a receiver having a chargeable object thereon. The chargeable object includes a substrate and a surface layer, as previously discussed. At block 102, the surface layer is annealed with an alternating current output induced from the emitter to the receiver. The surface layer is annealed for a period of time such that the surface layer presents a normalized unit structure having at least one phonon representing a micro-crystal surface effect and absorption band. Additionally, the annealing occurs for a length of time such that the surface layer presents imperfect harmonic interaction with the carrier wave.

While this invention has been described with reference to illustrative embodiments, this description is not intended to be construed in a limiting sense. Various modifications and combinations of the illustrative embodiments as well as other embodiments of the invention, will be apparent to persons skilled in the art upon reference to the description. It is, therefore, intended that the appended claims encompass any such modifications or embodiments.

What is claimed is:

1. A method for ordering the surface structure of a material to create a pseudo-antenna, the method comprising:

- transmitting an alternating current into a driver coupled to a primary emitting winding of an emitter;
- inducing the alternating current into a secondary emitting winding of the emitter;
- sensing the frequency of the alternating current on the secondary emitting winding;
- transmitting a feedback signal to the driver;
- applying a carrier wave to the alternating current, the carrier wave having a frequency (f) expressed in Hertz represented by the following vector equation:

$$f=(1,7,4)+(1,1,1)\text{ MOD }9;$$

- electromagnetically coupling the emitter to a receiver having a chargeable object thereon, the chargeable object including a substrate and a surface layer selected from the group consisting of tetrel-based and metal materials;
- annealing the surface layer with an alternating current output induced from the emitter to the receiver;
- annealing the surface layer for a period of time such that the surface layer presents a normalized unit structure having at least one phonon representing a micro-crystal surface effect and absorption band; and
- annealing the surface layer for a period of time such that the surface layer presents imperfect harmonic interaction with the carrier wave.

2. The method as recited in claim 1, wherein the receiver further comprises an electromagnetically coupleable cylinder for housing a plurality of chargeable objects, the plurality of chargeable objects being rings.

3. The method as recited in claim 1, wherein the receiver further comprises an electromagnetically coupleable plate for seating a plurality of chargeable objects, the plurality of chargeable objects being chips.

4. The method as recited in claim 1, wherein the receiver further comprises an electromagnetically coupleable tank for holding the chargeable object, the chargeable object being *Spirulina microalga*.

5. A method for ordering the surface structure of a material to create a pseudo-antenna, the method comprising:

- transmitting an alternating current into a driver coupled to a primary emitting winding of an emitter;
- inducing the alternating current into a secondary emitting winding of the emitter;
- sensing the frequency of the alternating current on the secondary emitting winding;
- transmitting a feedback signal to the driver;
- applying a carrier wave to the alternating current, the a carrier wave with a frequency ($f_n$) expressed in Hertz represented by the following equation:

$$f_n=(c/2\pi a)(\sqrt{n}+1)),$$

wherein c is the speed of light and a is the Earth's radius;

electromagnetically coupling the emitter to a receiver having a chargeable object thereon, the chargeable object including a substrate and a surface layer selected from the group consisting of tetrel-based and metal materials;

annealing the surface layer with an alternating current output induced from the emitter to the receiver;

annealing the surface layer for a period of time such that the surface layer presents a normalized unit structure having at least one phonon representing a micro-crystal surface effect and absorption band; and annealing the surface layer for a period of time such that the surface layer presents imperfect harmonic interaction with the carrier wave.

6. The method as recited in claim 5, wherein the receiver further comprises an electromagnetically coupleable cylinder for housing a plurality of chargeable objects, the plurality of chargeable objects being rings.

7. The method as recited in claim 5, wherein the receiver further comprises an electromagnetically coupleable plate for seating a plurality of chargeable objects, the plurality of chargeable objects being chips.

8. The method as recited in claim 5, wherein the receiver further comprises an electromagnetically coupleable tank for holding the chargeable object, the chargeable object being *Spirulina microalga*.

9. A method for ordering the surface structure of a material to create a pseudo-antenna, the method comprising:

transmitting an alternating current into a driver coupled to a primary emitting winding of an emitter;

inducing the alternating current into a secondary emitting winding of the emitter;

sensing the frequency of the alternating current on the secondary emitting winding;

transmitting a feedback signal to the driver;

applying a carrier wave to the alternating current, a carrier wave selected from the group consisting of waves with a frequency (f) expressed in Hertz represented by the following vector equation: f=(1,7,4)+(1,1,1) MOD 9, and waves with a frequency ($f_n$) expressed in Hertz represented by the following equation: $f_n=(c/2\pi a)(\sqrt{n(n+1)})$, wherein c is the speed of light and a is the Earth's radius;

electromagnetically coupling the emitter to a receiver having a chargeable object thereon, the chargeable object including a substrate and a surface layer selected from the group consisting of tetrel-based and metal materials;

annealing the surface layer with an alternating current output induced from the emitter to the receiver;

annealing the surface layer for a period of time such that the surface layer presents a normalized unit structure having at least one phonon representing a micro-crystal surface effect and absorption band; and annealing the surface layer for a period of time such that the surface layer presents imperfect harmonic interaction with the carrier wave.

* * * * *